United States Patent
Clingman et al.

(10) Patent No.: US 7,439,657 B2
(45) Date of Patent: Oct. 21, 2008

(54) BROADBAND ENERGY HARVESTER APPARATUS AND METHOD

(75) Inventors: Dan J Clingman, Auburn, WA (US); Gerardo Pena, Seattle, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 11/551,388

(22) Filed: Oct. 20, 2006

(65) Prior Publication Data

US 2008/0100180 A1    May 1, 2008

(51) Int. Cl.
*H01L 41/08* (2006.01)
(52) U.S. Cl. .................................. 310/339; 310/332
(58) Field of Classification Search ................. 310/330, 310/332, 339
See application file for complete search history.

(56) References Cited

U.S. PATENT DOCUMENTS

| | | | | |
|---|---|---|---|---|
| 4,396,852 | A * | 8/1983 | Hunt | 310/329 |
| 6,236,143 | B1 | 5/2001 | Lesieutre et al. | |
| 6,294,859 | B1 * | 9/2001 | Jaenker | 310/328 |
| 6,392,329 | B1 * | 5/2002 | Bryant et al. | 310/328 |
| 6,407,484 | B1 * | 6/2002 | Oliver et al. | 310/339 |
| 6,847,155 | B2 * | 1/2005 | Schwartz et al. | 310/328 |
| 2006/0119224 | A1 * | 6/2006 | Keolian et al. | 310/339 |
| 2006/0202592 | A1 | 9/2006 | Ruggeri et al. | |
| 2006/0238079 | A1 * | 10/2006 | Pei et al. | 310/339 |

FOREIGN PATENT DOCUMENTS

| | | |
|---|---|---|
| EP | 0742597 A1 | 11/1996 |
| WO | WO 02/061857 A1 | 8/2002 |
| WO | WO 02/086981 | 10/2002 |

OTHER PUBLICATIONS

Post-Buckled Precompressed (PBP) Actuators: Enhancing VTOL Autonomous High Speed MAVs by Ron Barrett; 46th AIAA/ASME/ASCE/AHS/ASC Structures, Structural Dynamics & Materials Conference Apr. 18-21, 2005, Austin, Texas.

(Continued)

*Primary Examiner*—Mark Budd
(74) *Attorney, Agent, or Firm*—Harness, Dickey & Pierce, P.L.C.

(57) ABSTRACT

A broadband vibration energy harvesting apparatus and method. In one embodiment, a straight piezoelectric beam and a straight biasing beam are disposed parallel to one another and axially compressed by a support structure such that both of the beams are slightly bowed. This buckles and reduces the axial stiffness of both of the beams. The piezoelectric beam is secured to an external vibrating structure and supported by the structure. The flexing motion of the piezoelectric beam generates electrical signals that can be used to power a wide variety of devices. The apparatus is especially sensitive to small amplitude vibration signals and is able to harvest vibration energy over a wide range of frequencies, and is not limited to vibrations at discrete resonant frequencies. The apparatus is especially well suited for use in powering remotely located electrical sensors and actuators employed in automotive, aircraft and aerospace applications.

22 Claims, 5 Drawing Sheets

OTHER PUBLICATIONS

Active Structures Using Buckling Beam Actuators by Eric M. Mockensturm; Jie Jiang; 44th AIAA/ASME/ASCE/AHS Structures, Structural Dynamics, and Materials Conference; Apr. 7-10, 2003, Norfolk, Virginia.

Improvement of actuation displacement of LIPCA implementing bifurcation phenomena by Quoc Viet Nguyen, Seungsik Lee, Hoon Cheol Park; Smart Structures and Materials 2006; Active Materials: Behavior and Mechanics, edited by William D. Armstrong, Proc. of SPIE vol. 6170, 6170L, (2006).

"Can a Coupling Coefficient of a Piezoelectric Device Be Higher Than Those of Its Active Material?" by George A. Lesieutre and Christopher L. Davis; reprinted from Journal of Intelligent Material Systems and Structures, vol. 8—Oct. 1997.

A Centrally-Clamped Parallel-Beam Bistable MEMS Mechanism by Jin Qiu, Jeffrey H. Lang, Alexander H. Slocum; 0-7803-5998-4/1/ $10.00@2001 IEEE.

A Curved-Beam Bistable Mechanism by Jin Qiu, Jeffrey H. Lang, Alexander H. Slocum; 1057-7157/04$20.00 copyright 2004IEEE.

* cited by examiner

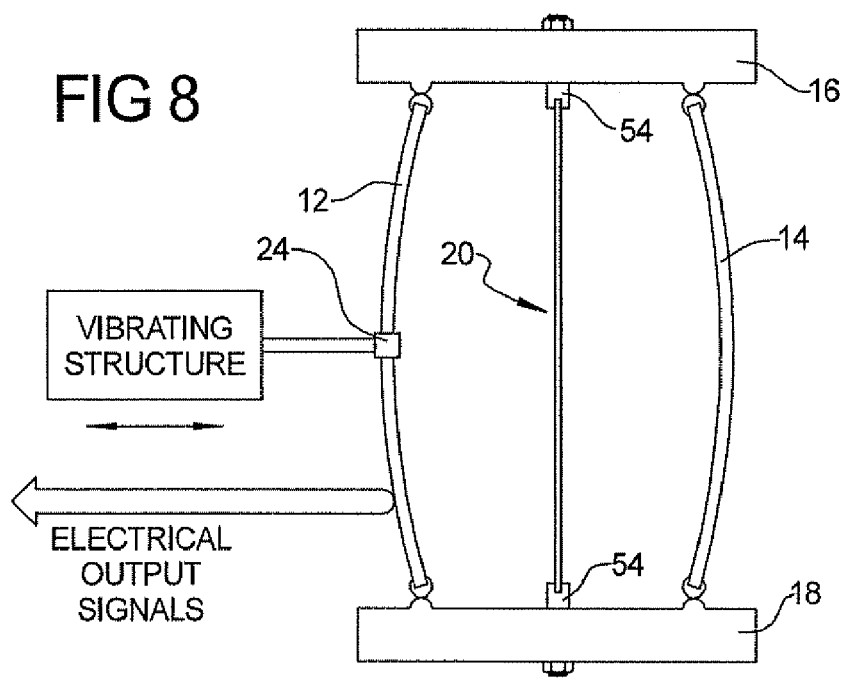
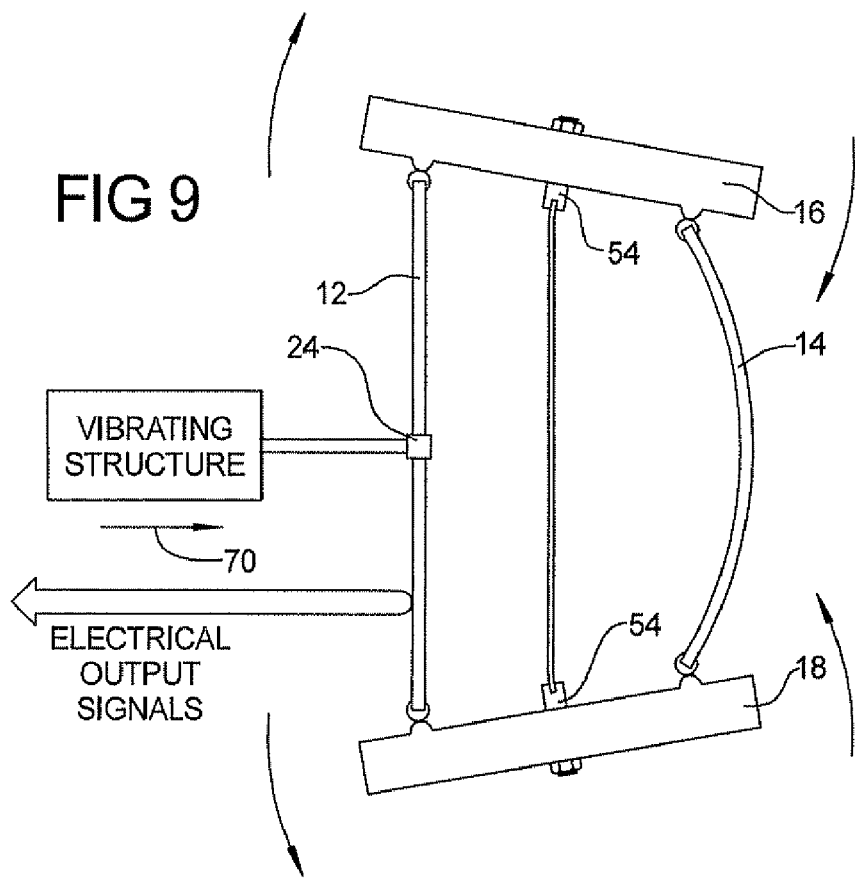

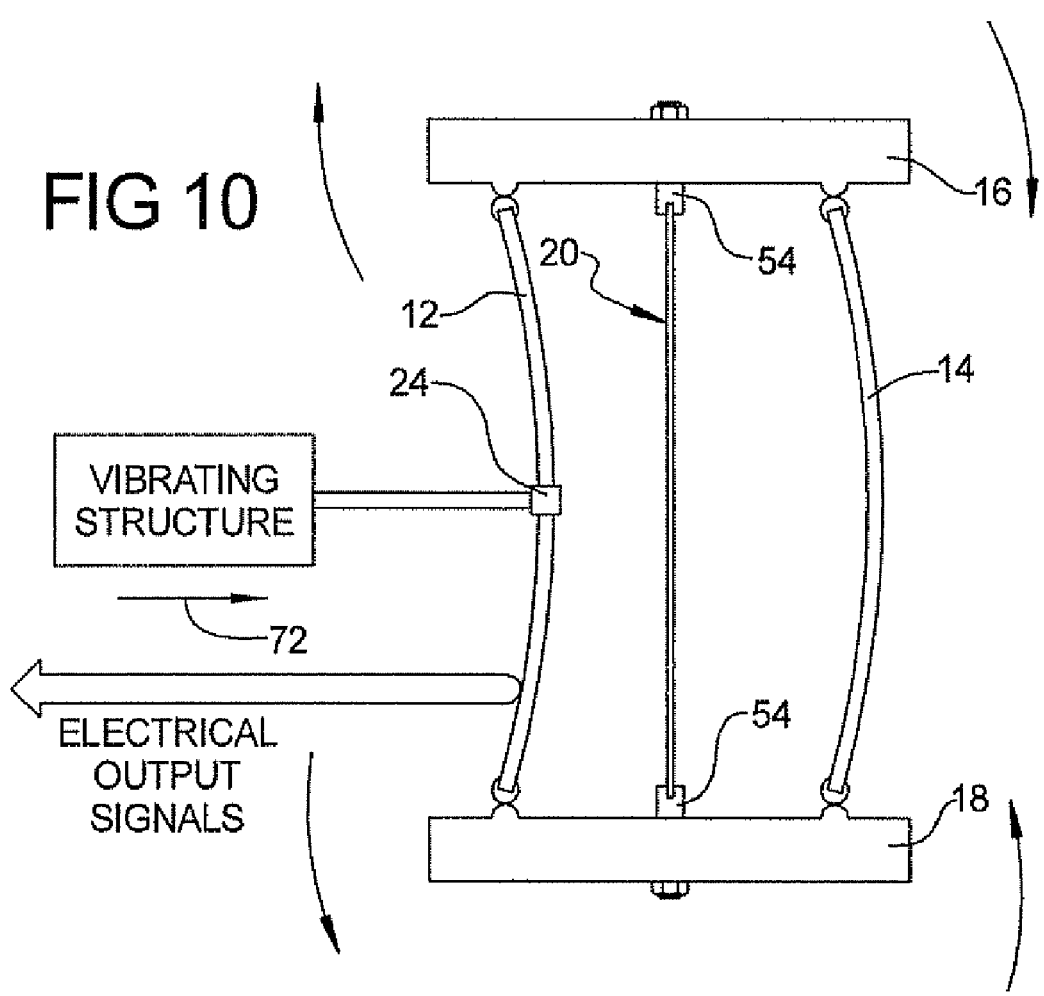

BROADBAND ENERGY HARVESTER APPARATUS AND METHOD

CROSS REFERENCE TO RELATED APPLICATIONS

The present application is related in general subject matter to the following applications, each of which being filed concurrently with the present application, and each of which is incorporated by reference into the present application:

U.S. application Ser. No. 11/551,525;
U.S. application Ser. No. 11/551,515;
U.S. application Ser. No. 11/584,304;
U.S. application Ser. No. 11/584,305.

TECHNICAL FIELD

The present disclosure relates to relates to energy harvesting devices and methods, and more particularly to a broadband energy harvesting apparatus and method that enables energy harvesting of small vibration amplitudes over a wide frequency band.

BACKGROUND

The statements in this section merely provide background information related to the present disclosure and may not constitute prior art.

Low power electronics and sensors are becoming prevalent, as are wireless transceivers, that allow various forms of sensors to be placed in remote and inaccessible locations on various structures, for example on various forms of aircraft and spacecraft. The demand for self-powered sensors and devices that are able to obtain electrical power through environmental energy harvesting is also increasing. Energy in various forms of vibrating structures is typically available over a wide range of frequencies. This is especially so in automotive applications, and particularly on or near wheels or on suspension components used with motor vehicles such as cars, trucks and SUVs. Typically, this energy is lost during normal operation of the structure or platform on which the energy harvesting device is being employed. Thus, an autonomous, inexpensive and reliable energy harvesting device that is able to harvest vibration energy over a wide frequency range, and is responsive to very small amplitudes of vibration energy, would be highly useful in powering remotely located sensors and other forms of devices.

A principal disadvantage of many present-day energy harvesting devices is that such devices harvest vibration energy primarily at one or more frequencies. It would enhance the utility and efficiency of an energy harvesting device significantly if such a device was responsive to vibration energy over a wide frequency band, as well as responsive to very small amplitudes of vibration energy.

Still further, a vibration energy harvesting device that is highly compact and lightweight, and which is able to harvest vibration energy over a wide frequency band, would enable electrical power to be generated that could be used to power remotely located sensors and other devices. The ability to provide electrical power to remotely located sensors and various devices would eliminate the need to extend cabling or other forms of conductors to the devices. it would further enable the use of sensors in various forms of electrically powered devices at locations on various structures, for example on aircraft and spacecraft, where it might otherwise be impractical or impossible to place a sensor because of the need to run electrical cabling to the sensor to power the sensor.

SUMMARY

The present disclosure is related to an energy harvesting apparatus and method. In one embodiment an energy harvesting apparatus is provided that includes a beam and a biasing member. The beam includes electrically responsive material. In one implementation the electrically responsive material comprises at least one piezoelectric layer of material. The beam and the biasing member are both supported from a support structure and compressed while being supported. The compression significantly softens the electrically responsive material of the beam, thus promoting ready flexing of the beam in response to small amplitudes of vibration. The beam is secured to an external structure that generates vibration energy. The biasing member operates to apply a biasing force to the beam that enhances flexing motion of the beam in response to vibration.

As the beam experiences vibration, it flexes, which causes the electrically responsive material on the beam to generate electrical signals. These electrical signals are routed through suitable conductors from the electrically responsive material and used to provide electrical power to an external device, for example a sensor or an actuator.

In one specific implementation, a pair of proof masses are used to support the beam and the biasing member. A coupling element extends between the two proof masses and urges the proof masses towards one another, thus compressing the beam and the biasing member. In this implementation the biasing member also comprises a beam that is flexible. The proof masses are further coupled via the coupling element such that they are able to pivot as both beams flex in response to vibration.

In various implementations, the energy harvesting apparatus and method of the present disclosure provide an extremely compact, lightweight system that enables it to be readily secured to various forms of external structures and/or sensors, actuators, etc., to harvest vibration energy being experienced by the structure, sensor, or actuator.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 8 is a simplified side view of the apparatus prior to experiencing vibration from a vibrating structure;

FIG. 9 is a simplified view of the apparatus of FIG. 8 as it experiences a vibrating force that tends to flatten out the piezoelectric beam; and FIG. 10 is a view of the apparatus with the piezoelectric beam flexed past an over center position to approximately a point of maximum flexure.

DETAILED DESCRIPTION

Figure 1:
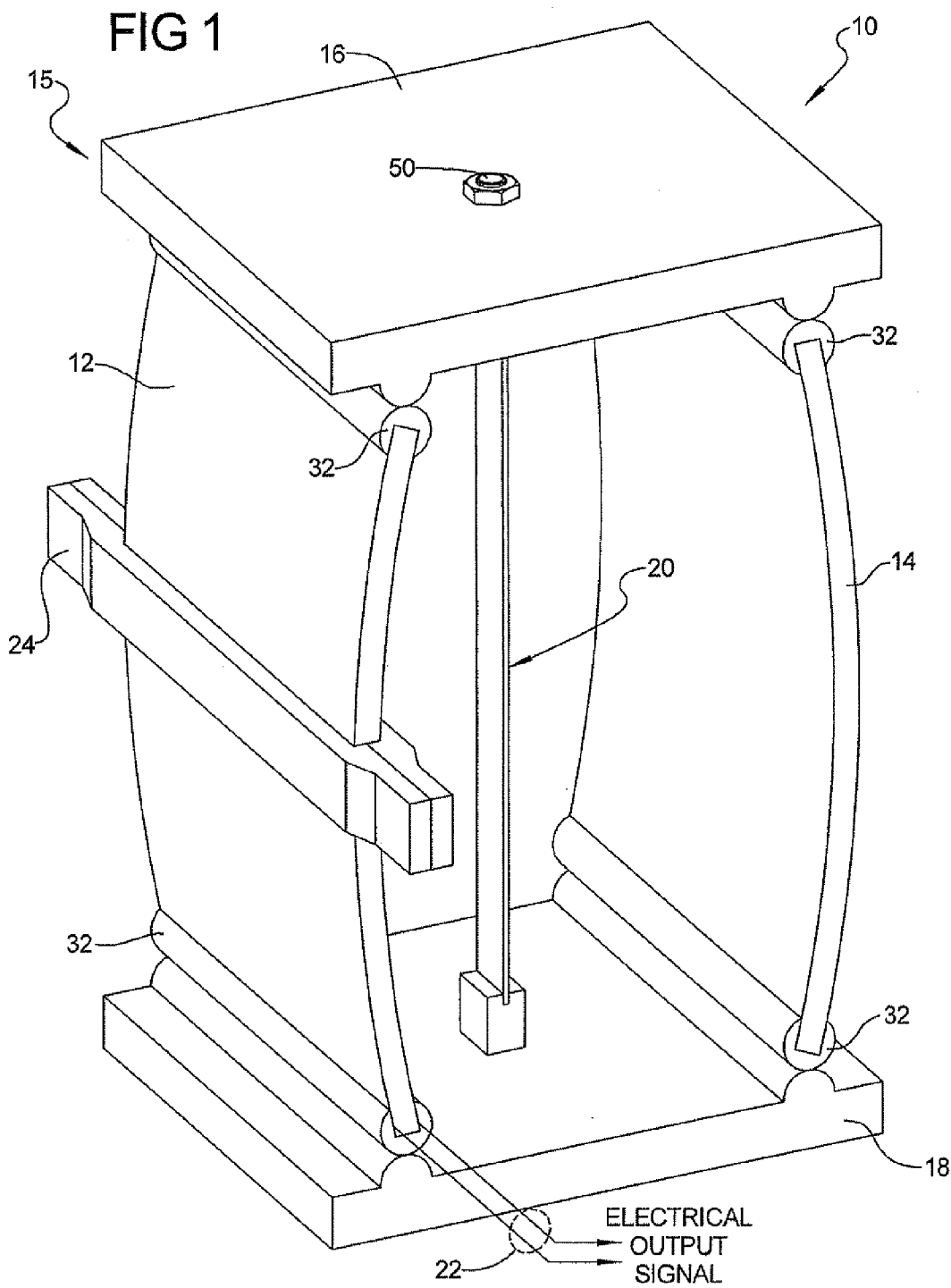
FIG. 1 is a perspective view of one embodiment of an energy harvesting apparatus in accordance with the present disclosure.

The following description is merely exemplary in nature and is not intended to limit the present disclosure, its application or uses. It should be understood that throughout the drawings, corresponding reference numerals indicate like or corresponding parts and features.

Referring to FIG. 1, there is shown a bimorph. broadband energy harvester apparatus 10 in accordance with one implementation of the present disclosure. In this embodiment, the apparatus 10 includes a first, normally straight. electrically responsive beam, in this instance a piezoelectric beam 12, and a second biasing member in the form of a biasing beam 14. The beams 12 and 14 are held slightly compressed by a supporting structure 15 so as to be normally slightly bowed or "buckled". The supporting structure 15 includes a plate forming an upper proof mass 16, a plate forming a lower proof mass 18, and a coupling assembly 20 that draws the proof masses 16 and 18 towards one another to compress the beams 12 and 14. Suitable electrical leads are coupled to the piezoelectric beam to receive electrical output signals generated by the beam 12 as the beam flexes. An attachment structure 24 permits the apparatus to be attached to or supported either partially or entirely, from a vibrating structure. Although it will be appreciated that the apparatus 10 is not limited to such an attachment arrangement.

It will be appreciated that in some applications, the piezoelectric beam 12 may instead incorporate a magnetostrictive material. Thus, other forms of electrically responsive materials may be used to help form the beam 12 rather than piezoelectric material.

Figure 2:
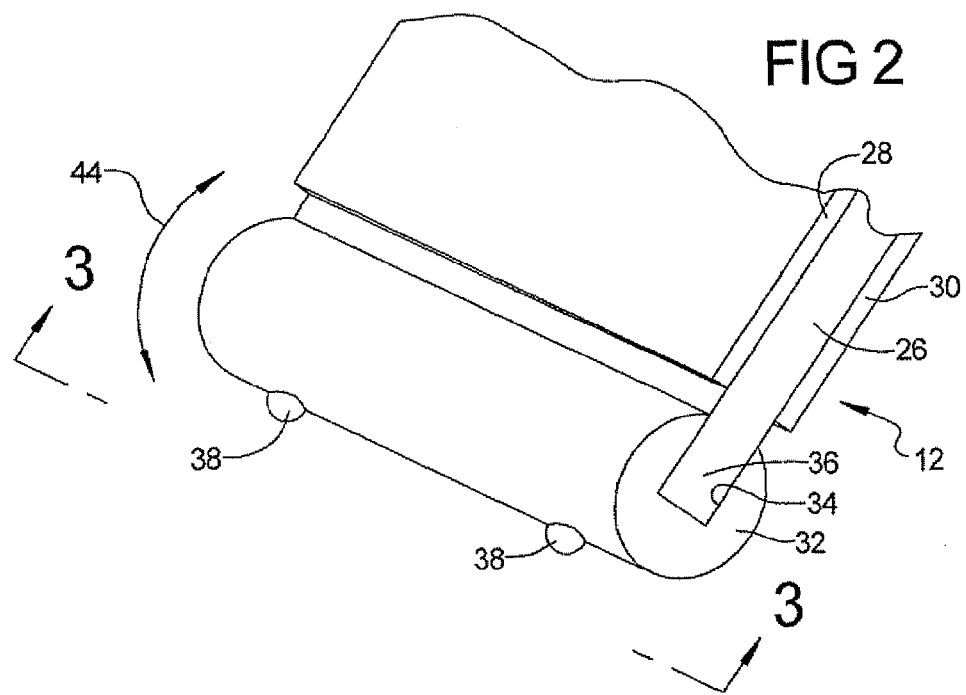
FIG. 2 is a perspective view of one end portion of the piezoelectric beam used with the apparatus in FIG. 1.
Figure 3:
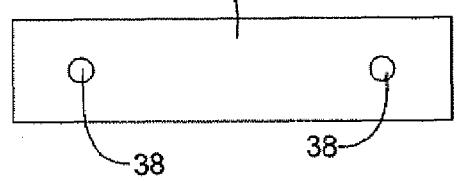
FIG. 3 is an end view of the piezoelectric beam in accordance with directional arrows 3-3 in FIG. 2.
Figure 6:
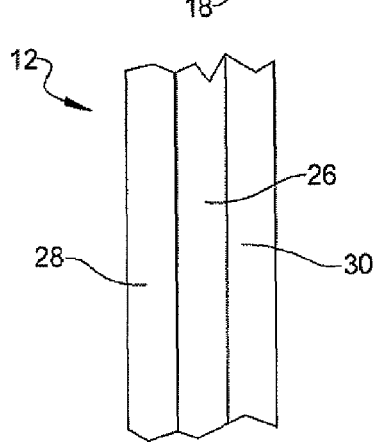
FIG. 6 is a side view of a portion of the piezoelectric beam.

With reference to FIGS. 2 and 6, the piezoelectric beam 12 comprises a multi-layer assembly having a center substrate 26, and piezoelectric material layers 28 and 30 adhered on opposing surfaces of the center substrate 26. The center substrate 26 may be formed from any suitable, slightly flexible material, and in one implementation is formed by a carbon laminate material layer having a zero degree fiber orientation. In one embodiment, the center substrate 26 has dimensions of approximately 2.0 inches (50.8 mm) in length, 0.5 inch (12.7 mm) in width, and 0.05 inch (1.27 mm) in thickness. Piezoelectric material layers 28 and 30, in this example, have dimensions of about 1.45 (36.83 mm) inch in overall length, 0.45 inch (11.43 mm) in width, and 0.05 inch (1.27 mm) in thickness. It will be appreciated, however, that these dimensions may vary significantly depending upon the needs of a specific application. Each piezoelectric material layer 28, 30 may be formed from one or more distinct layers that are adhered or otherwise bonded together.

With further reference to FIG. 2, each end of the piezoelectric beam 12 includes a support element 32 having a slot 34 that receives an end portion 36 of the piezoelectric material layer 26. End portion 36 may be adhered, soldered, or otherwise secured fixedly within the slot 34. The support element 32 is preferably circular in shape and includes one or more bumps or protrusions 38 that provide bearing alignment and work together with the circular shape of its associated support element 32 to provide extremely low friction bearing pivot surfaces that facilitate flexing movement of the piezoelectric beam 12. It will be appreciated that both ends of the piezoelectric beam 12 are secured to separate support elements, such as support element 32 shown in FIG. 2. Similarly, both ends of the biasing beam 14 are coupled to separate support elements, such as support element 32, shown in FIG. 1. A detailed discussion of one specific construction of one embodiment of the piezoelectric beam 12 and its method of manufacture is disclosed in U.S. application Ser. No. 11/584, 304, filed concurrently herewith, and incorporated by reference into the present application. It will be appreciated, however, that the support element 32 can have other forms or configurations which permit relative motion, including only one pivotal end, without departing from the scope of this disclosure.

Figure 4:
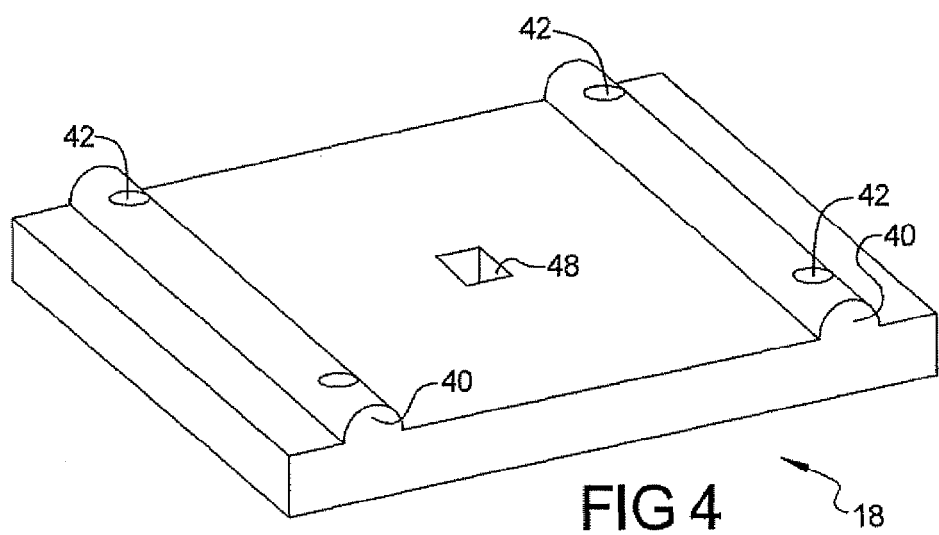
FIG. 4 is a perspective view of the lower proof mass used to support the piezoelectric and biasing beams.

Referring to FIG. 4, the lower proof mass 18 is shown in greater detail. The proof mass 18 is formed from any suitably rigid material, for example steel or aluminum, or possibly even high strength plastic. In this embodiment the proof masses 16 and 18 are similar in construction and are sufficiently rigid so that they do not flex during operation of the apparatus 10. The proof mass 18 includes a pair of raised ribs 40 that each has at least one, and more preferably a pair, of hemispherical recesses 42. Recesses 42 are positioned to align with the spacing of the protrusions 38, and each has a diameter generally in accordance with the diameter of the protrusions 38. In this manner, for example, when the support element protrusions 38 (FIG. 2) are situated in one pair of recesses 42, the support element 32 is able to freely rotate in accordance with arrow 44 in FIG. 2. The engagement of protrusions 38 within their respective recesses 42 provides a low friction, bearing-like support arrangement that facilitates smooth rotational movement of the support element 32 relative to the proof mass 18. Other configurations, including a support element without protrusions, are feasible.

With further reference to FIG. 4, the lower proof mass 18 also includes a generally square shaped opening 46 to enable the coupling assembly 20 to secure to the proof mass 18. In this embodiment proof mass 16 is identical in construction to proof mass 18, as will be explained in connection with FIG. 5.

Figure 5:
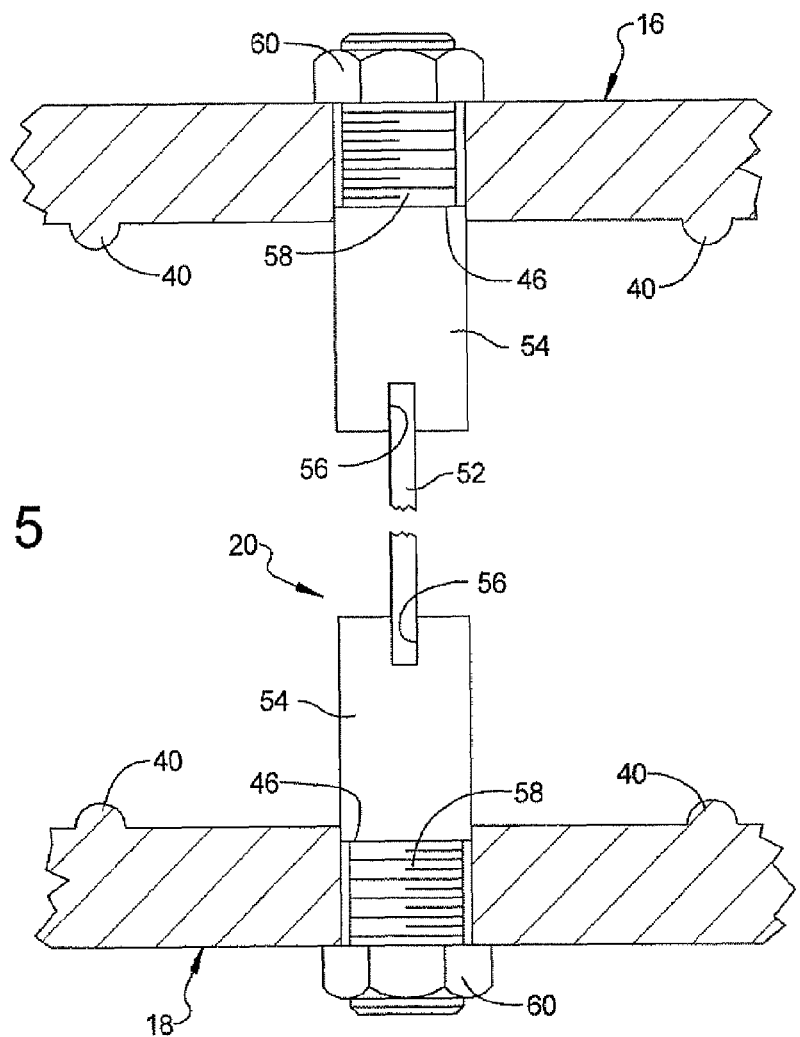
FIG. 5 is a side view of the structure which enables attachment of the coupling member to the lower proof mass.

Referring to FIG. 5, a substantial portion of the coupling assembly 20 is shown. The coupling assembly 20 includes a coupling element 52, which in one implementation is a steel ribbon. Although there is one coupling assembly 20 on the illustrated embodiment, there could be more. The coupling element 52 is secured such as by soldering or adhesives to an attachment component 54 having a slot 56 for receiving an end of the coupling element 52. The attachment component 54 includes a threaded portion 58 that extends through the hole 48 and engages with a threaded nut 60. The generally square shaped opening 46 in FIG. 4 restricts the attachment component 54 from rotation, allowing the nut 60 to be adjusted without rotating the attachment component 54. The nut 60 enables a desired axial pre-loading force to be imparted to the beams 12 and 14. A second attachment component 54 and second nut 60 is used to secure the opposite distal end of the coupling element 52 in like fashion.

Figure 7:
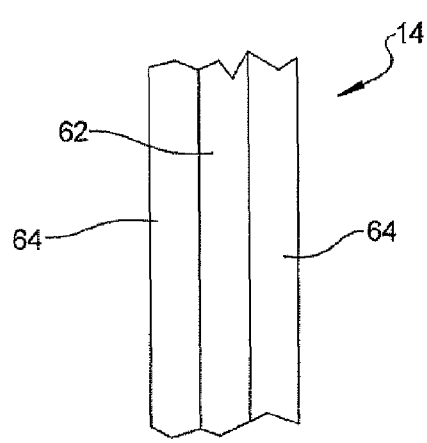
FIG. 7 is a side view of a portion of the biasing beam.

With reference to FIGS. 1 and 7, the biasing beam 14 also comprises a multi-layer assembly having a center substrate 62 and a pair of outer substrates 64 on outer opposing surfaces of the center substrate 62. In one form, the center substrate 62 comprises a carbon laminate material layer having a fiber orientation of zero degrees and orientated along the beam 14 major axis. This enhances the lengthwise bending toughness of the beam 14 while still allowing the widthwise bending stiffness to remain "soft". In this implementation, the substrates 64 are also formed by carbon laminate layers, with each having a fiber orientation of between about 25 degrees- 30 degrees. The dimension of the center substrate 62 of the biasing beam 14 and the center substrate 26 of the piezoelectric beam 12 may also be identical in dimensions, and the substrates 64 may be identical in dimensions to the piezoelectric material layers 28 and 30. The beams 12 and 14, in one implementation, have preferably the same bending stiffness along their longitudinal lengths. In one embodiment, the beams 12 and 14 also have the same coefficient of thermal expansion.

An advantage of the coupling assembly 20 and proof masses 16 and 18 is that these components form an especially compact, lightweight and effective arrangement for holding the beams 12 and 14 in an initially compressed orientation, such that each of the beams 12 and 14 is bowed or flexed slightly as shown in FIGS. 1 and 8. Since the apparatus 10 forms a highly compact arrangement, it is well suited for use in a wide variety of applications where space limitations might not permit the use of larger energy harvesting assemblies. The use of a buckled beam for the bias beam 14 is a distinct advantage over other forms of force biasing mechanisms in that the buckled bias beam 14 provides a very low axial stiffness compared to other biasing mechanisms such as compression springs.

Turning now to FIGS. 8-10. a description of operation of the apparatus 10 will be provided. FIG. 8 illustrates the apparatus 10 before the apparatus has received any vibrating energy from a vibrating structure. In this example, it will be noted that the beams 12 and 14 are compressed so as to be bowed approximately equally. Both beams 12 and 14 can be viewed as being in a stable position. An equally likely orientation is with beam 12 bowed in and beam 14 bowed out. This does not change the function of the apparatus 10.

In FIG. 9, a vibration force directed in accordance with arrow 70 is imparted to the attachment structure 24, which causes the piezoelectric beam 12 to flex into a substantially flat orientation. This causes a simultaneous flexing of the biasing beam 14. The proof masses 16 and 18 pivot freely as the beams 12 and 14 are flexed. As the piezoelectric beam 12 flexes from the position shown in FIG. 8 to that shown in FIG. 9, it generates electrical signals that can be used to power an external sensor, actuator, or other forms of electrical components. The compressive force exerted by the proof masses 16 and 18 serve to buckle the piezoelectric beam 12 and reduce stiffness or substantially "soften" the beam. That enables broadband energy harvesting because the beam 12 readily flexes in response to small amplitude forces and at a relative wide range of frequencies.

Referring to FIGS. 9 and 10, as the vibration force continues to be directed along arrow 72 in FIG. 10, the piezoelectric beam moves past an over center position (essentially defined by the orientation of the piezoelectric beam 12 in FIG. 9), into another bowed orientation, as shown in FIG. 10. As the vibrating force changes direction, the piezoelectric beam 12 will again begin to flex towards the flattened out position shown in FIG. 9. During this opposite flexing motion, the piezoelectric beam 12 will generate another electrical signal or pulse. This signal or pulse, however, will have a polarity opposite to that of the signal or pulse that was generated during its initial movement from the position shown in FIG. 8 into the position of FIG. 9. Thus, the alternate flexing movement of the piezoelectric beam 12 will be assisted by the biasing member 14. and the piezoelectric beam 12 will generate two electrical pulses or signals for each flexing cycle. This construction also operates to restrain the motions of beams 12 and 14 due to high amplitude vibrations. When the piezoelectric beam 12 flexes to a displacement where the biasing beam 14 becomes straight, the biasing beam 14 will no longer provide a bias force and the piezoelectric beam 12 will become stiff, thus restraining further motions.

In manufacturing the piezoelectric beam 12, one method of manufacture may employ using a pair of piezoelectric material sheets that are positioned on opposing surfaces of a prepreg material at room temperature. The laminate may be cured at 200° C. Since the coefficient of thermal expansion for the carbon fibers is greater than that of the piezoelectric sheets, when the laminate cools the piezoelectric sheets are in compression. This is advantageous because piezoelectric material is better able to convert strain energy into electrical energy when it operates in compression.

The apparatus 10 is especially well suited for aerospace and automotive applications. In both aerospace and automotive applications, there is a need to locate electronic sensors or actuators on remote areas of a vehicle or structure. In such instances, it is often impractical to route wiring to the sensor or actuator for the purpose of providing power to the component. Often, the use of batteries to power the component is impractical or impossible. Since the apparatus 10 is able to produce electrical signals that can be used to power an electrical powered component, the elimination of a battery provides the additional advantage that environment disposal concerns are eliminated, which would otherwise be present with the use and replacement of a battery. The ability to place the apparatus 10 in virtually any location on a vehicle adds significant flexibility in allowing various forms of electrically powered components to be placed in locations that would otherwise not be practical or possible if batteries and electrical wiring was required for communicating power to the component(s).

By axially preloading both of the beams 12 and 14 to the point where both beams are slightly buckled, the piezoelectric beam 12 is significantly softened, and the overall stiffness of both of the beams 12 and 14 is significantly decreased. When the attachment structure 24 is secured to a vibrating structure, the piezoelectric beam 12 is highly responsive to even small amplitudes of vibration, and at low frequencies (typically above 0.5 Hz. Thus, very low vibration forces are able to be sensed by the apparatus 10, and such small forces generate high strains on the piezoelectric beam 12. This is in contrast to many present day energy harvesting systems, which rely on harvesting energy at one or more discrete resonant frequencies. The apparatus 10, being especially sensitive to very small vibration amplitudes, enables vibration energy harvesting over a much wider frequency range than is typically possible with existing resonant frequency energy harvesting devices.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. An energy harvesting apparatus, comprising:
a beam including an electrically responsive material, and attachment structure for enabling the beam to be coupled to an external structure experiencing vibration;
a force biasing member disposed adjacent said beam;
a support structure for engaging each of said beam and said biasing member, and capable of applying compressive force to said beam and said biasing member, to soften said beam and biasing members; and
said beam adapted to flex in response to vibration from said external structure, to generate electrical signals, and said biasing member being adapted to bias said beam to promote flexing movement of said beam in response to vibration.

2. The apparatus of claim 1, wherein each of said beam and said biasing member have a lengthwise bending stiffness, and wherein the stiffnesses are substantially the same.

3. The apparatus of claim 1, wherein said beam comprises a substrate material on which said electrically responsive material is disposed.

4. The apparatus of claim 1, wherein said electrically responsive material comprises a piezoelectric material.

5. The apparatus of claim 1, wherein said beam comprises a substrate member having opposing planar surfaces, with each of said opposing planar surfaces including a layer of said electrically responsive material disposed thereon; and
wherein said layers of electrically responsive material each comprise a piezoelectric layer of material.

6. The apparatus of claim 1, wherein said beam and said biasing member are constructed to have substantially the same coefficients of thermal expansion.

7. The apparatus of claim 1, wherein said beam comprises:
a carbon laminate substrate having first and second opposing surfaces; and
a piezoelectric material layer disposed on each of said first and second opposing surfaces.

8. The apparatus of claim 7, wherein said carbon laminate substrate comprises a fiber orientation of zero degrees.

9. The apparatus of claim 1, wherein said biasing member comprises:
a center substrate having first and second opposing surfaces; and
outer substrates formed on the first and second opposing surfaces of the center substrate.

10. The apparatus of claim 9, wherein:
said center support substrate comprises a carbon laminate having a fiber orientation of zero degrees; and
said outer substrates each comprise a carbon laminate having a fiber orientation from about 25 degrees to about 30 degrees.

11. The apparatus of claim 1, wherein:
said beam includes a carbon laminate substrate having first and second opposing surfaces, and wherein said electrically responsive material includes a piezoelectric material layer disposed on each of said first and second opposing surfaces; and
said biasing member includes a center support substrate having first and second opposing surfaces, and outer substrates formed on the first and second opposing surfaces of the center support substrate; and
wherein said outer substrates and said piezoelectric material layers all have approximately the same dimensions.

12. The apparatus of claim 11, wherein said carbon laminate substrate and said center substrate are each formed with a zero degree fiber orientation.

13. The apparatus of claim 1, wherein said support structure comprises:
a first proof mass for engaging a first end of each of said beam and said biasing member;
a second proof mass for engaging a second end of each of said beam and said biasing member;
a member communicating with said proof masses at an intermediate position on each said proof mass, and between areas where said ends of said beam and said biasing member are engaging said proof masses, to urge said proof masses towards one another and thus axially compress said beam and said biasing member; and
said member being operatively engaged with said proof masses to enable pivoting movement of both of said proof masses about areas where said ends of said beam and said biasing member are engaging said proof masses.

14. The apparatus of claim 13, wherein at least one of said proof masses includes an opening for receiving an end portion of said member, said opening being shaped to prevent rotational movement of said end portion of said member as said member is used to axially compress said beams.

15. The apparatus of claim 13, wherein at least one end of said beam comprises at least one protrusion, and wherein one of said proof masses includes a recess for engaging said protrusion, and wherein engagement of said protrusion within said recess forms a bearing arrangement that promotes pivoting movement of said one proof mass relative to said beam.

16. An energy harvesting apparatus, comprising:
a first beam including:
a support substrate
piezoelectric material layer secured to said support substrate for generating electrical output signals in response to flexing motion of the first beam; and
attachment structure for enabling the first beam to be coupled to an external structure experiencing vibration;
a second beam being flexible and disposed generally adjacent said first beam; and
a support structure for axially compressing both of said beams to soften said beams, and such that both of said beams assume a bowed shape, said softening of said first beam enabling said first beam to readily flex in response to vibration.

17. The apparatus of claim 16, wherein said first beam and said second beam have approximately the same axial stiffness.

18. The apparatus of claim 16, wherein said first beam comprises a pair of piezoelectric material layers on opposing surfaces of said support substrate.

19. The apparatus of claim 18, wherein said piezoelectric material layers are approximately equal in length, width and thickness to said outer carbon laminate layers.

20. The apparatus of claim 16, wherein said second beam comprises a center carbon laminate substrate with opposing surfaces, and outer carbon laminate layers secured to said opposing surfaces.

21. A method for harvesting vibration energy, comprising:
disposing a beam having an electrically responsive material adjacent a biasing member, each of said beam and biasing member being compressible;
supporting said beam and said biasing member under compression, and such that said compression softens said electrically responsive material of said beam;
securing said beam to a vibrating structure such that vibration generated by said vibrating structure causes flexing of said beam, with said electrically responsive material generating electrical signals in response to said vibration; and
using said biasing member to promote flexing movement of said beam.

22. The method of claim 21, wherein supporting said beams under compression comprises supporting said beam and said biasing member generally parallel to one another, and between a pair of proof mass members; and
coupling said proof mass members to one another with a coupling member that compresses both said beam and said biasing member while enabling said proof mass members to both move pivotally relative to said coupling member as said beam flexes.

* * * * *